(12) United States Patent
Grodzki et al.

(10) Patent No.: US 9,696,400 B2
(45) Date of Patent: Jul. 4, 2017

(54) METHOD AND APPARATUS FOR OPTIMIZATION OF A PULSE SEQUENCE FOR A MAGNETIC RESONANCE SYSTEM

(71) Applicants: David Grodzki, Erlangen (DE); Mathias Nittka, Baiersdorf (DE)

(72) Inventors: David Grodzki, Erlangen (DE); Mathias Nittka, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 616 days.

(21) Appl. No.: 14/057,361

(22) Filed: Oct. 18, 2013

(65) Prior Publication Data
US 2014/0111200 A1 Apr. 24, 2014

(30) Foreign Application Priority Data
Oct. 18, 2012 (DE) .................. 10 2012 219 010

(51) Int. Cl.
*G01V 3/00* (2006.01)
*G01R 33/54* (2006.01)
(Continued)

(52) U.S. Cl.
CPC ....... *G01R 33/543* (2013.01); *G01R 33/4833* (2013.01); *G01R 33/3854* (2013.01); *G01R 33/5617* (2013.01)

(58) Field of Classification Search
CPC ......... G03G 2215/0119; G03G 15/238; G03G 15/232; G03G 15/234; G03G 2215/00586
(Continued)

(56) References Cited

U.S. PATENT DOCUMENTS 6,008,647 A * 12/1999 Zhou ................ G01R 33/56581
324/306
6,198,282 B1 3/2001 Dumoulin
(Continued)

OTHER PUBLICATIONS

Leupold et al., "Moment and Direction of the Spoiler Gradient for Effective Artifact Suppression in RF-Spoiled Gradient Echo Imaging"; Magnetic Resonance in Medicine, vol. 60; pp. 119-127 (2008).

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

A method and a pulse sequence optimization device to optimize a pulse sequence for a magnetic resonance system, wherein the pulse sequence includes at least one refocusing pulse, one slice selection gradient pulse, and one gradient spoiler pulse. The pulse duration of the refocusing pulse is shortened, and the pulse duration of the slice selection gradient pulse is adapted to the shortened pulse duration of the refocusing pulse. The amplitude of the slice selection gradient pulse is increased so that the same slice thickness is selected as before the shortening of the pulse duration of the refocusing pulse. The pulse shape of the gradient spoiler pulse is adapted without changing a total spoiler moment, and an optimally shortened pulse duration of the refocusing pulse is achieved when, with the adaptation of the pulse shape of the gradient spoiler pulse, the maximum amplitude of the gradient spoiler pulse equals the amplitude of the slice selection gradient pulse, and an edge steepness of the gradient spoiler pulse is minimized.

11 Claims, 6 Drawing Sheets

(51) Int. Cl.
 *G01R 33/483* (2006.01)
 *G01R 33/385* (2006.01)
 *G01R 33/561* (2006.01)

(58) Field of Classification Search
 USPC .......................................................... 324/309
 See application file for complete search history.

(56) References Cited

U.S. PATENT DOCUMENTS

2009/0212772 A1\* 8/2009 Ookawa ............. G01R 33/5615
 324/309
2011/0267055 A1 11/2011 Umeda
2013/0200893 A1 8/2013 Heismann et al.

\* cited by examiner

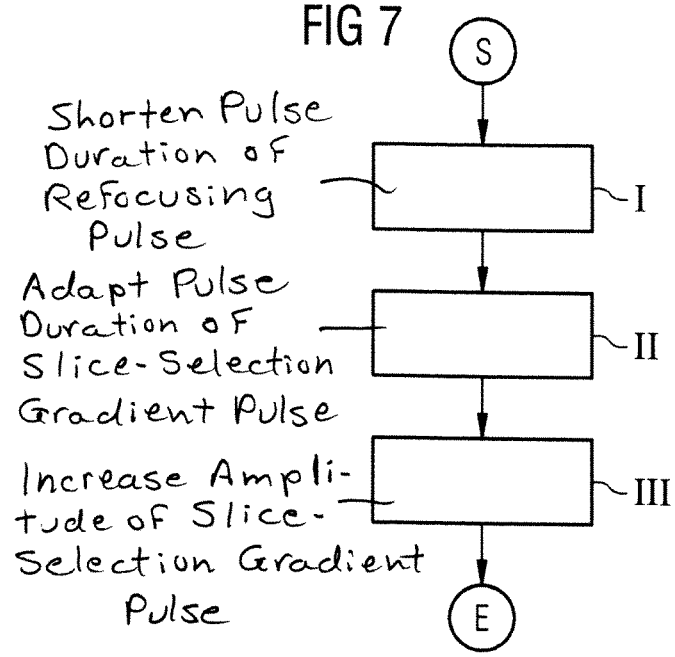
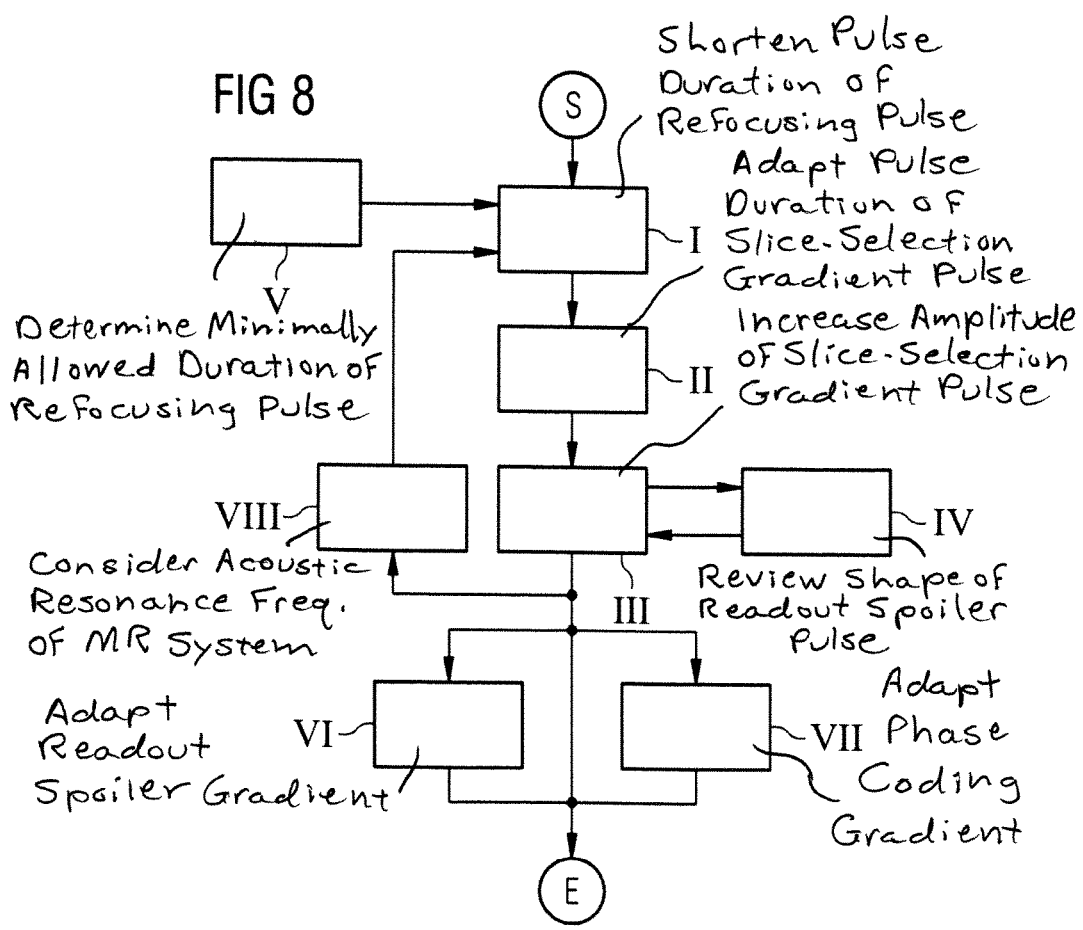

METHOD AND APPARATUS FOR OPTIMIZATION OF A PULSE SEQUENCE FOR A MAGNETIC RESONANCE SYSTEM

BACKGROUND OF THE INVENTION

Field of the Invention

The present invention concerns a method to optimize a magnetic resonance pulse sequence that includes a slice-selection gradient pulse and a gradient spoiler pulse, for operating a magnetic resonance system. Moreover, the invention concerns a method to operate a magnetic resonance system using such an optimized pulse sequence, and a pulse sequence optimization device for a magnetic resonance system in order to implement this method.

Description of the Prior Art

In a magnetic resonance system (also called a magnetic resonance tomography system), the body to be examined is typically exposed to a relatively high basic magnetic field (for example of 1, 5, 3 or 7 Tesla) with the use of a basic field magnet system. A magnetic field gradient is additionally applied by a gradient system. Radio-frequency excitation signals (RF signals) are then emitted by a radio-frequency transmission system by means of suitable antennas, which causes nuclear spins of specific atoms, excited to resonance by this radio-frequency field, to be flipped by a defined flip angle relative to the magnetic field lines of the basic magnetic field. Upon relaxation of the nuclear spins, radio-frequency signals (known as magnetic resonance signals) are radiated that are received by suitable reception antennas, and are then processed further. Finally, the desired image data can be reconstructed from the raw data acquired in such a manner.

For a defined measurement, a defined pulse sequence must be emitted, which includes a series of radio-frequency pulses (in particular excitation pulses and refocusing pulses) and gradient pulses that are emitted in coordination in different spatial directions, as well as suitably placed readout windows during which the induced magnetic resonance signals are detected. The timing within the sequence—i.e. the time intervals at which pulses follow one another—is particularly significant to the imaging. A number of control parameters are normally defined in a measurement protocol, which is created in advance and, for a defined measurement, can be retrieved (from a memory, for example) and possibly modified on site by the operator, who can predetermine additional control parameters (for example a specific slice interval of a stack of slices to be measured, a slice thickness etc.). A pulse sequence (which is also designated as a measurement sequence) is then calculated on the basis of all of these control parameters.

The gradient pulses are defined by their gradient amplitudes, the gradient pulse duration and their edge steepness dG/dt (typically also designated as a "slew rate"). An additional important gradient pulse variable is the gradient pulse moment that is defined by the integral of the amplitude over time.

During a pulse sequence, the magnetic gradient coils with which the gradient pulses are emitted are switched frequently. Eddy currents that are then produced in other components of the magnetic resonance tomography (in particular the radio-frequency shield) and interact with the magnetic fields to produce Lorentz forces, which are one reason for the well-known noise generation during the switching of the gradients. In particular, a high edge steepness contributes to the noise exposure. In addition, steep edges lead to a higher power consumption and additionally place higher demands on the hardware. The rapidly changing gradient fields lead to distortions and oscillations in the gradient coils and to the transmission of these energies to the apparatus housing.

In order to reduce the noise exposure, different solutions have been proposed in the design of the hardware, for example potting or vacuum-sealing the gradient coils. Another possibility is to pay particular attention to the gradient curve already in the calculation of the pulse sequences. In practice, there are therefore apparatuses that offer what are known as different "gradient modes". The operator can choose between a normal mode and a particularly quiet gradient mode, for example. In the quiet gradient mode, a maximum allowable edge steepness for the gradient pulses is set to a lower value, which leads to the situation that the measurement is quieter than in a normal mode. A disadvantage in the selection of such a quiet gradient mode is that not only is the measurement time made longer overall, but also the image quality (for example the contrast and/or the resolution) is reduced. Given such a limitation of the overall maximum slew rate, a compromise must always be found between the reduction of the noise volume, the measurement time and the image quality. For example, a longer echo spacing (thus a longer interval between the echoes) thus has a negative effect on the contrast and the image sharpness.

In a number of pulse sequences that are used in clinical magnetic resonance tomography (MRT)—for example in spin echo (SE) sequences or turbo spin echo (TSE) sequences—pulses known as gradient spoiler pulses (shortened to spoilers) are activated in addition to the gradient pulses necessary for spatial coding. Gradient spoiler pulses (which are also called gradient crusher pulses—shortened to crushers—in some cases, particularly if they occur in pairs) are emitted by the same gradient coils immediately before and/or after the actual gradient pulses, and ensure that (for example) unwanted free induction decay (FID) signals are suppressed. To ensure suppression of the FID signals with certainty, the spoilers or crushers must have a defined spoiler or crusher moment. In the present application, spoilers or spoiler pulses are normally used, and this designation always includes crushers as well. For differentiation, as used herein spoiler pulses that are emitted before or after slice-selection gradients are designated as gradient spoilers, while spoiler pulses that are executed before or after readout gradients are designated as readout spoilers.

As noted above, the time requirements within a pulse sequence are very strict. In addition, the total duration of a pulse sequence (which determines the total duration of an MRT examination) should be kept as short as possible. Therefore, not much time is provided for the execution of the spoilers. This means that the spoiler amplitudes must necessarily be high to achieve a defined spoiler moment, which leads to high edge steepness of the spoiler pulses directly.

A large part of the noise in MRT examinations, particularly given the use of SE or TSE sequences, therefore results from the spoiler pulses.

SUMMARY OF THE INVENTION

An object of the present invention is to provide a suitable optimization method as well as a corresponding pulse sequence optimization device for optimization of pulse sequences that include at least one refocusing pulse, a slice-selection gradient pulse and a gradient spoiler pulse.

in accordance with the invention, a pulse sequence whose parameters have been determined in a known manner is an input variable of the method to optimize a pulse sequence for a magnetic resonance system. The pulse sequence or its parameters result(s) from the imaging task to be achieved. The pulse sequence includes at least one refocusing pulse, a slice-selection gradient pulse and a gradient spoiler pulse. The time length, amplitude and edge steepness of this gradient spoiler are respectively determined. The gradient spoiler pulse or gradient spoiler lies chronologically before or after the slice-selection gradient pulse. The pulse sequence is optimized for a noise reduction. The pulse duration of the refocusing pulse is thereby shortened. A refocusing pulse is also called a rephasing pulse and serves to bundle again the divergent phases of the signals radiated from the excited nuclei.

A shortening of the pulse duration means an increase of the bandwidth of the refocusing pulse, since the pulse duration is inversely proportional to the bandwidth. The shortening of the pulse duration of the refocusing pulse entails a shortening of the pulse duration of the slice-selection gradient pulse, since this is adapted to the shortened pulse duration of the refocusing pulse. The slice-selection gradient pulse serves for the selection of the slice in the examination subject at which the refocusing should act. The slice-selection gradient pulse is radiated simultaneously with the refocusing pulse so that this acts only on the selected slice.

The amplitude of the slice-selection gradient pulse is increased so that the same slice thickness is selected as before the shortening of the pulse duration of the refocusing pulse. The optimization should not have any influence on the image acquisition defined by the pulse sequence, thus also no influence on the selected slice.

A pulse shape of the gradient spoiler pulse is adapted to the shortened slice-selection gradient pulse without changing a total spoiler moment. By shortening the pulse durations of the refocusing pulse and the slice-selection gradient pulse, more time is available for the spoiler pulse without the time requirements (provided by the input pulse sequence) being changed, such that a modification is possible. The total spoiler moment results from the sum of gradient spoiler moment and a readout spoiler moment. The two spoiler moment types can be merged since the suppression of FID signals is to be achieved independent of whether it is a gradient spoiler moment or a readout spoiler moment.

An optimally shortened pulse duration of the refocusing pulse is achieved by, in the adaptation of the pulse shape of the gradient spoiler pulse, the maximum amplitude of the gradient spoiler pulse is set to equal the amplitude of the slice-selection gradient pulse, and minimizing the edge steepness of the gradient spoiler pulse. Such an adaptation of the pulse shape is possible when the amplitude of the slice-selection gradient pulse has been increased sufficiently, corresponding to the bandwidth increase of the refocusing pulse; and the pulse duration of the slice-selection gradient pulse has been sufficiently shortened, corresponding to the shortened pulse duration of the refocusing pulse. The pulse shape of the gradient spoiler corresponds to a triangular shape when the aforementioned requirements are satisfied. The spoiler fuses with the slice-selection gradient pulse. In the case of a spoiler pair before and after the slice-selection gradient pulse (for example what are known as crushers), the three pulses together produce a trapezoidal pulse.

The invention is based on the insight that it is possible to reduce the edge steepness of gradient pulses, and in particular of spoiler pulses, and therefore to bring about a noise reduction, by initially modifying parameters of a refocusing pulse while maintaining predetermined chronological pulse intervals in order to therefore achieve a tolerance for variations in the gradient curve. According to the invention, a refocusing pulse is optimized that is not the cause of the noise exposure. With this optimization, a noise volume reduction by approximately 1 to approximately 10 dBA is achieved relative to pulse sequences in which the gradient curve has already been designed with regard to a noise minimization.

In a method according to the invention for the operation of a magnetic resonance system, the pulse sequence to be used for such operation is initially optimized and then the magnetic resonance system is operated using the optimized pulse sequence. Less noise arises during the measurement (i.e. when a patient is situated in a patient tunnel of the system) without losses in the image quality, and without the measurement duration being extended.

A pulse sequence optimization device according to the invention for the optimization of a pulse sequence for a magnetic resonance system has an input interface to receive parameters that define the pulse sequence. This pulse sequence is a pulse sequence that includes at least one refocusing pulse, a slice selection gradient pulse and a gradient spoiler pulse. For example, it can be an SE or a TSE sequence.

The pulse sequence optimization device also has a refocusing pulse unit to determine a shortened pulse duration of the refocusing pulse. The pulse optimization device is configured to shorten the pulse duration of the refocusing pulse, not the time intervals between successive pulses.

The pulse sequence optimization device also has a slice selection gradient pulse unit that adapts a pulse duration of the slice selection gradient pulse to the shortened pulse duration of the refocusing pulse and to increase an amplitude of the slice selection gradient pulse. The slice selection gradient pulse is executed simultaneously with the refocusing pulse in order to determine the slice in which a refocusing takes place. When the refocusing pulse is chronologically shortened, the slice selection pulse is also shortened. The shortening of the refocusing pulse means an increase of its bandwidth. The increase of the bandwidth means that the amplitude of the slice selection pulse must be increased so that the same slice thickness is selected as before the shortening of the pulse duration of the refocusing pulse.

The pulse sequence optimization device also has a gradient spoiler pulse unit that adapts the pulse shape of gradient spoiler pulse. The pulse shape adaptation takes place without a change of the total spoiler moment, thus of the integral of the pulse amplitude over time, or demonstratively without a variation of the area under the pulse amplitude—in the case of the total spoiler moment without a variation of the sum of the area under the readout spoiler amplitude and the area under the gradient spoiler amplitude.

An optimally shortened pulse duration of the refocusing pulse is achieved when, in the adaptation of the pulse shape of the gradient spoiler pulse, the maximum amplitude of the gradient spoiler pulse is set to equal the amplitude of the slice selection gradient pulse, and an edge steepness of the gradient spoiler pulse is minimized. The amplitude of the slice selection gradient pulse is increased due to the increase of the bandwidth of the refocusing pulse. At the same time, more time is provided for the gradient spoiler pulse via the chronological shortening of the slice selection gradient pulse. Its amplitude therefore can be reduced given a simultaneous (temporal) widening of the pulse. In the optimal case, the pulse assumes a triangular shape; there is only just a rising edge or ramp, thus neither a flat amplitude curve nor a falling ramp.

Basic parts of the pulse sequence optimization device can be designed in the form of software components. This is particularly suitable for the refocusing pulse unit, the slice selection gradient pulse unit and the gradient spoiler pulse unit. For example, the input interface can be an interface in order to accept data regarding a pulse sequence from a data store via a network, or a data store within a control device of a magnetic resonance system. The interface can be formed at least in part in the form of software and can possibly access hardware interfaces of an existing computer.

The invention thus also includes a non-transitory, computer-readable data storage medium that can be loaded directly into a memory of a pulse sequence optimization device, on which program code is stored to cause all steps of the method according to the invention to be executed when the program is run in the pulse optimization device. Such a realization in software has the advantage that previous devices that are used to determine pulse sequences (for example suitable computers in computing centers of the magnetic resonance manufacture) can be suitably modified via implementation of the program in order to optimize pulse sequences in the manner according to the invention, which pulse sequences are connected with a lower noise volume.

In an embodiment, the pulse shape of the gradient spoiler pulse is adapted without changing the gradient spoiler moment. That has the advantage that only the gradient spoiler pulse must be considered for the optimization; the readout spoiler can thereby remain unconsidered.

In another embodiment, if the gradient spoiler moment is kept constant a greater degree of freedom results on the other hand. The gradient spoiler moment can be varied in order to achieve an optimal pulse shape, for example, and the difference relative to the original gradient spoiler moment is added to the readout spoiler moment.

The shortened pulse duration of the refocusing pulse can be achieved by extending the refocusing pulse in the amplitude direction. The fundamental pulse shape predetermined by the original pulse shape of the refocusing pulse is therefore not affected. The extension of the refocusing pulse in the amplitude direction leads to a shortened pulse duration.

In another embodiment, the shortened pulse duration can also be achieved via a modification of the pulse shape of the refocusing pulse. Although this results in a somewhat increased computing cost, this embodiment allows a flexible change to shorten the pulse duration.

For example, the method according to the invention can be applied in its various embodiments in a spin echo sequence or a turbo spin echo sequence. The optimization of the gradient curve via an optimization of the pulse duration of the refocusing pulse thereby leaves an echo interval between the individual spin echoes of the (turbo) spin echo sequences unmodified.

In the case of a (turbo) spin echo sequence, the optimization can be made for at least a plurality of refocusing pulses. The optimization can also be conducted for all refocusing pulses of the pulse sequence. The number of steep edges is therefore markedly reduced; each steep edge produces noise upon switching of the corresponding coil.

The shortening of the pulse duration of the refocusing pulse involves an increase of the bandwidth of the refocusing pulse. An increase of the bandwidth leads to an increase of the radio-frequency amplitudes, which in turn increases the SAR load of the patient (SAR—specific absorption rate, measure of the absorption of electromagnetic fields in biological tissue). The method therefore can be developed such that a minimum allowed pulse duration of the refocusing pulse is determined in that a maximum SAR limitation that is predetermined for the pulse sequence is not exceeded. The minimum allowed pulse duration of the refocusing pulse that is determined in such a manner then may not be exceeded in the optimization. For example, this requirement can be complied with via an iterative optimization process. An optimally shortened pulse duration of the refocusing pulse is thus determined in which the spoiler pulse shape is optimal, and if the maximum SAR limitation has thereby been exceeded the spoiler pulse is successively modified again, meaning that its ramp is made steeper and the amplitude is increased until the SAR value is below the maximum allowed SAR limitation. The iteration process can alternatively also be terminated upon reaching the minimum allowed pulse duration.

The shortening of the refocusing pulse or refocusing pulses allows more time not only for the gradient spoiler pulses, but also for the readout spoiler pulses and the phase coding pulses. In addition to the modification of the gradient spoiler pulses (and possibly the readout spoiler pulse) to keep the total spoiler moment constant, it is therefore possible to likewise reduce the edge steepness of the readout spoiler pulse or, respectively, the readout spoiler pulses and/or the phase coding pulses. It should be noted again that edge steepness is frequently also designated as slew rate. Both the readout spoiler pulses an the phase coding pulses contribute to the noise development in a magnetic resonance system. If these edges are likewise designed to be flatter, this therefore leads to an additional noise reduction. This can be in a range from approximately 1 to approximately 10 dBA.

A modification of the edge steepness of the gradient spoiler pulses, the readout spoiler pulses and/or the phase coding pulses leads to a shift (displacement) of the frequency spectrum. If the edge is flatter, lower frequencies are to be expected. It is thereby possible for these lower frequencies to match an acoustic resonance frequency of the magnetic resonance system, such that the expected noise reduction does not occur in its full scope. In an embodiment of the method, if at least one acoustic resonance frequency of the magnetic resonance system lies within a frequency spectrum of the adapted gradient spoiler pulse, the pulse duration of the refocusing pulse or refocusing pulses varies away from the optimally shortened pulse duration. This variation has the result that the frequency spectrum shifts and the acoustic resonance frequency lies outside of the frequency spectrum. The achieved noise reduction is then greater than with the actual optimally shortened pulse duration, although the edge steepness increases again. It is possible to determine this variation of the pulse duration in an iterative process to avoid an acoustic resonance frequency.

The method can be developed to the extent that initially the frequency spectrum of the adapted gradient spoiler pulse and/or of the adapted readout spoiler pulse and/or of an adapted phase coding pulse is determined. In a further step, this frequency spectrum is compared with at least one acoustic resonance frequency of the magnetic resonance system. If the acoustic resonance frequency falls in the defined frequency spectrum, as described above the pulse duration of the refocusing pulse can be varied and the spoiler pulses and/or phase coding pulses can be adapted to the modified pulse duration, meaning that its edges are designed to be steeper again. In summary, an optimized pulse sequence does not have the optimally shortened pulse duration of the refocusing pulse. The optimized pulse sequence should cause the lowest noise exposure, and it should not exceed a SAR limitation.

BRIEF DESCRIPTION OF THE DRAWINGS

FIG. 7 is a flowchart of an embodiment of the method according to the invention.

FIG. 8 is a more detailed flowchart of an additional embodiment of the method according to the invention.

DESCRIPTION OF THE PREFERRED EMBODIMENTS

Figure 1:
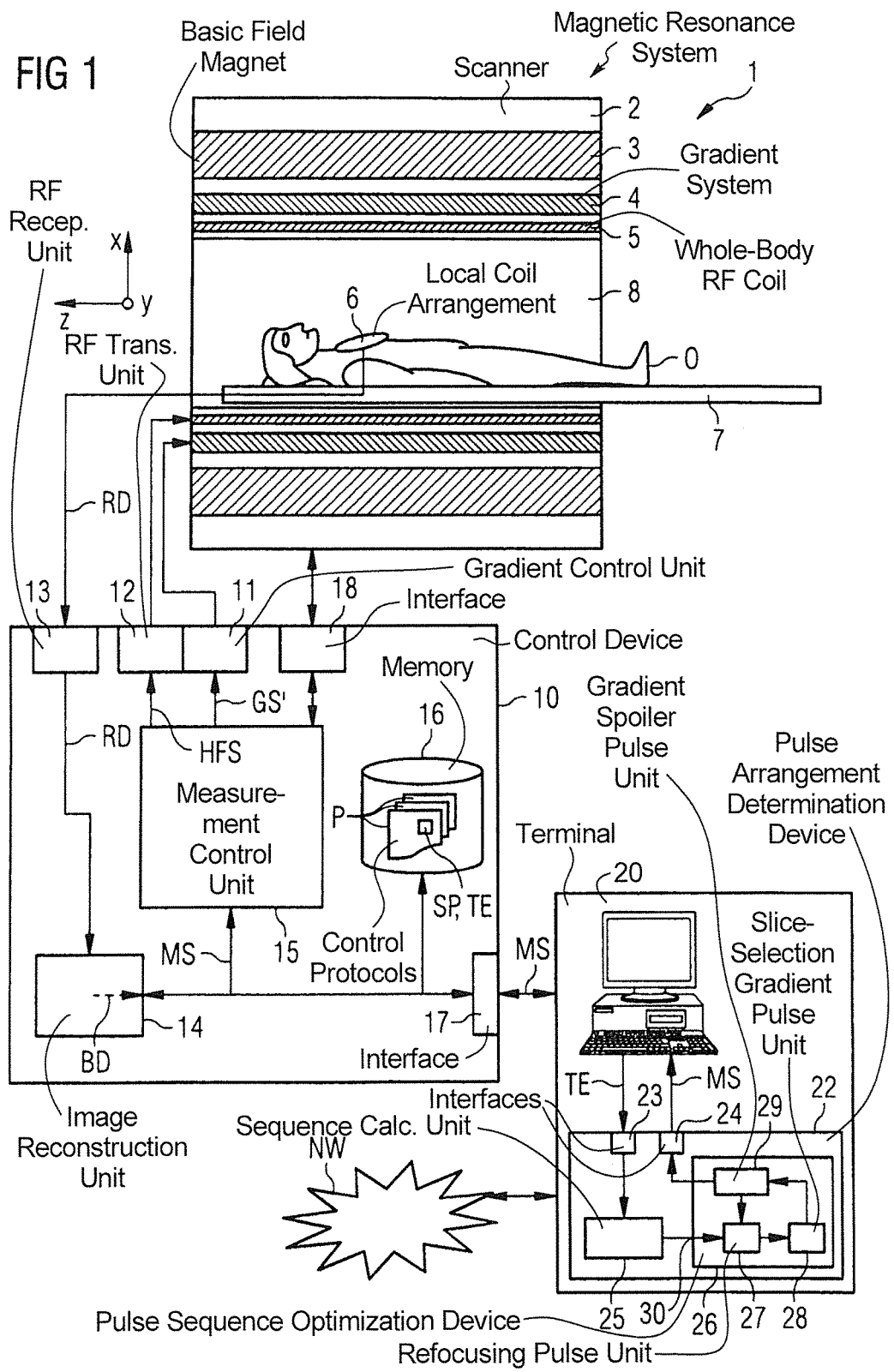
FIG. 1 schematically illustrates an exemplary embodiment of a magnetic resonance system according to the invention.

A magnetic resonance system 1 according to the invention is schematically shown in FIG. 1. It includes the actual magnetic resonance scanner (data acquisition unit) 2 with an examination space or patient tunnel located therein. A bed 7 can be driven into this patient tunnel 8, such that a patient O or examination subject on said bed 7 can be supported at a defined position within the magnetic resonance scanner 2 relative to the magnet system and radio-frequency system arranged therein during an examination, or can be moved between different positions during a measurement.

Basic components of the magnetic resonance scanner are a basic field magnet 3, a gradient system 4 with magnetic field gradient coils to generate magnetic field gradients in the x-, y- and z-directions, and a whole-body radio-frequency coil 5. The magnetic field gradient coils can be controlled independently of one another in the x-, y- and z-direction so that gradients can be applied in arbitrary spatial directions (for example in the slice-selection direction, in the phase coding direction and/or in the readout direction) via a predetermined combination, with these directions normally depending on the selected slice orientation. The reception (detection) of magnetic resonance signals induced in the examination subject O can take place via the whole-body coil 5, with which the radio-frequency signals are normally also emitted in order to induce the magnetic resonance signals. However, these induced signals are typically received with a local coil arrangement 6 formed by one or more (for example) local coils (of which only one is shown) placed on or below the patient O. All of these components are known in principle to those skilled in the art and therefore are only schematically shown in FIG. 1.

The components of the magnetic resonance scanner 2 can be controlled by a control device 10. This can be a control computer that can also embody a number of individual computers (which may be spatially separated and connected among one another via suitable cables or the like). This control device 10 is connected via a terminal interface 17 with a terminal 20 via which an operator can control the entire system 1. In the present case, this terminal 20 (as a computer) is equipped with keyboard, one or more monitors and additional input devices (for example mouse or the like) so that a graphical user interface is provided to the operator.

Among other things, the control device 10 has a gradient control unit 11 that can in turn comprise multiple sub-components. Via this gradient control unit 11, the individual gradient coils are connected with control signals according to a gradient pulse sequence GS. As describe above, these are hereby gradient pulses that are placed at precisely provided time positions and with a precisely predetermined time curve during a measurement. Gradient pulses include slice selection gradient pulses, readout pulses, phase coding pulses and spoilers.

The control device 10 also has a radio-frequency transmission unit 12 in order to feed electrical signals representing respective radio-frequency pulses to the whole-body radio-frequency coil 5 according to a predetermined radio-frequency pulse sequence RFS of the pulse sequence MS. The radio-frequency pulse sequence RFS also includes the refocusing pulses mentioned above. The reception of the magnetic resonance signals then occurs with the use of the local coil arrangement 6, and the raw data RF received therefrom, are read out and processed by an RF reception unit 13. The magnetic resonance signals are passed in digital form as raw data RF to a reconstruction unit 14, which reconstructs the image data BD from the raw data and stores the image data BD in a memory 16 and/or passes the image data BD via the interface 17 to the terminal 20 so that the operator can view the image. The image data BD can also be stored at other locations via a network NW and/or be displayed and evaluated. Alternatively, a radio-frequency pulse sequence can be emitted via the local coil arrangement and/or the magnetic resonance signals can be received by the whole-body radio-frequency coil (not shown).

Control commands are transmitted via an additional interface 18 to other components of the magnetic resonance scanner 2 (such as the bed 7 or the basic field magnet 3, for example), or measurement values or, respectively, other information are obtained.

The gradient control unit 11, the RF transmission unit 12 and the RF reception unit 13 are controlled, coordinated respectively, by a measurement control unit 15. Appropriate commands cause the desired gradient pulse sequences GS and radio-frequency pulse sequences RFS to be emitted. Moreover, for this purpose, it must be ensured that the magnetic resonance signals are read out at the local coils of the local coil arrangement 6 by the RF reception unit 13 at the appropriate point in time and are processed further. The measurement control unit 15 likewise controls the interface 18.

The basic implementation of such a magnetic resonance measurement and the cited components to control it are known to those skilled in the art, and thus need not be described in further in detail herein. Moreover, such a magnetic resonance scanner 2 and the associated control device can have an additional components that are likewise not explained in detail herein. It should also be noted that the magnetic resonance scanner 2 can also be designed differently, for example with a laterally open patient space, or as a smaller scanner in which only one body part is positioned.

In order to start a measurement, via the terminal an operator typically selects a control protocol P provided for the desired measurement from a memory 16, in which a number of control protocols P for different measurements are stored. Among other things, this control protocol P includes various control parameters SP, TE for the respective measurement. Among these control parameters are specific basic rules for the desired pulse sequence, for example whether it is a spin echo sequence, a turbo spin echo sequence, etc. Additionally among these are control parameters that set the magnetizations to be achieved via the individual radio-frequency pulses, rules about the k-space trajectory to be used to enter the raw data into k-space, as well as parameters that set slice thicknesses, slice intervals, number of slices, echo time TE in a spin echo sequence, etc.

Through the terminal 20, the operator can modify some of these control parameters in order to create an individual control protocol for a currently desired measurement. For this purpose, variable control parameters are offered for modification at a graphical user interface of the terminal, for example.

Moreover, via a network NW the operator can retrieve control protocols (for example from a manufacturer of the magnetic resonance system) and then possibly modify and use these protocols.

A measurement sequence MS is then determined based on the control parameters SP including the selected time parameters TE, with which measurement sequence SP the actual control of the remaining components via the measurement control unit 15 ultimately takes place. The pulse sequence MS can be calculated in a pulse sequence determination device 22, which here is shown as part of the terminal 20 and, for example, can be realized in the form of software components at the computer of this terminal 20. In principle, however, the pulse sequence determination device 22 can also be part of the control device 10 itself, in particular of the measurement control unit 15. However, the pulse sequence determination device could also similarly be realized at a separate computer system which is connected with the magnetic resonance system via the network NW, for example.

The pulse sequence determination device comprises an input interface 23 to accept control parameters SP, TE. The control parameters SP, TE are passed to a pulse sequence calculation unit 25 that determines a pulse sequence. A pulse sequence optimization device 26 according to the invention can be integrated into the pulse sequence determination device 22 or be executed as a separate block. It received the output signal of the pulse sequence calculation unit 25 as an input signal.

The pulse sequence optimization device 26 has a refocusing pulse unit 27, a slice selection gradient pulse unit 28 and a gradient spoiler pulse unit 29 in which the optimization according to the invention is conducted. The units 27, 28 and 29 are connected with one another. A return of data from each unit to each unit can occur for an iterative determination of the optimized pulse sequence. Only a feedback from the gradient spoiler pulse unit 29 to the refocusing pulse unit 27 is presented in FIG. 1 (not in a limited manner). The pulse sequence optimization device 26 also comprises an input interface 30 via which the pulse sequence calculated by the pulse sequence calculation unit 25 is received.

The optimized pulse sequence can be supplied as an output again via a pulse sequence interface 24 and, for example, can be passed via the terminal interface 17 to the measurement control unit 15 so that the measurement then proceeds fully automatically. Parameters of the optimized pulse sequence can be displayed at the terminal to the user and thus be accepted or rejected by him. However, the optimization can also run fully automatically without the user receiving knowledge of this, or at least receiving no communication of details about individual parameter changes. That is possible since the pulse optimization here has an effect only on the noise development, but has no influence on the image quality. As mentioned above, not only a pulse sequence but rather a series of such pulse sequences that are then executed in series) is typically generated for a measurement in order to thus acquire the necessary raw data RF for the desired image data BD.

Figure 2:
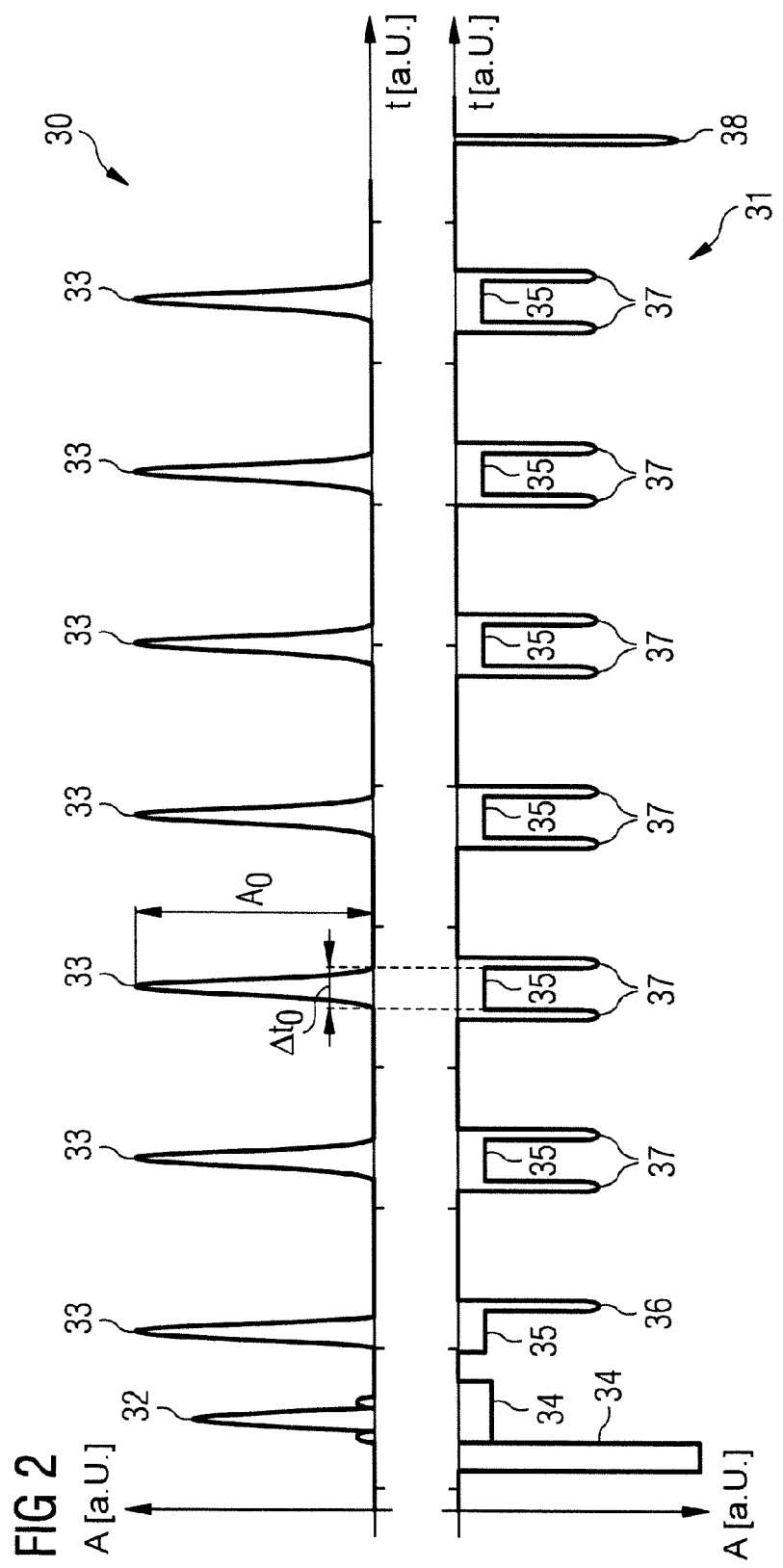
FIG. 2 shows a turbo spin echo sequence to which the method according to the invention can be applied.

In a graph 30, FIG. 2 shows radio-frequency pulses whose amplitude A is shown over time t, respectively in arbitrary units (a.U.). Slice selection gradient pulses belonging to these are shown under this in graph 31, likewise with its amplitude over time, respectively in arbitrary units.

The radio-frequency pulse sequence includes an excitation pulse 32 that is calculated so that it deflects defined atomic nuclear spins by a defined flip angle. The excitation pulse is not affected by the optimization according to the invention. Refocusing pulses, or even rephasing pulses 33 (which produce a rephasing of the divergent nuclear spins in a known manner), follow the excitation pulse 32. The refocusing pulses 33 respectively have an amplitude $A_0$ and a pulse duration $\Delta t_0$.

Slice selection gradient pulses 34 are executed simultaneously so that the excitation pulse 32 and the refocusing pulses 33 act on a defined, selected slice. The slice selection gradient pulses 34 that are executed during the excitation pulse 32 are not discussed in detail here since they are nonessential to the understanding of the invention. The optimization also does not have an effect at this point.

The refocusing pulses 33 are respectively accompanied by simultaneously executed slice selection gradient pulses 35. The slice selection gradient pulses 35 have the same pulse duration $\Delta t_0$ as the refocusing pulses 33. The first slice selection gradient pulse 35—which is executed simultaneously with the first refocusing pulse 33—has a gradient spoiler pulse 36. The chronologically following slice selection gradient pulses 35 respectively have a gradient spoiler pulse 37 before and after the pulse. These gradient spoiler pulse pairs 37 can also be designated as crusher pulses. In conclusion, a last spoiler pulse 38 follows if a refocusing pulse is no longer executed. The method according to the invention affects the gradient spoiler pulses 36 and 37.

Figure 3:
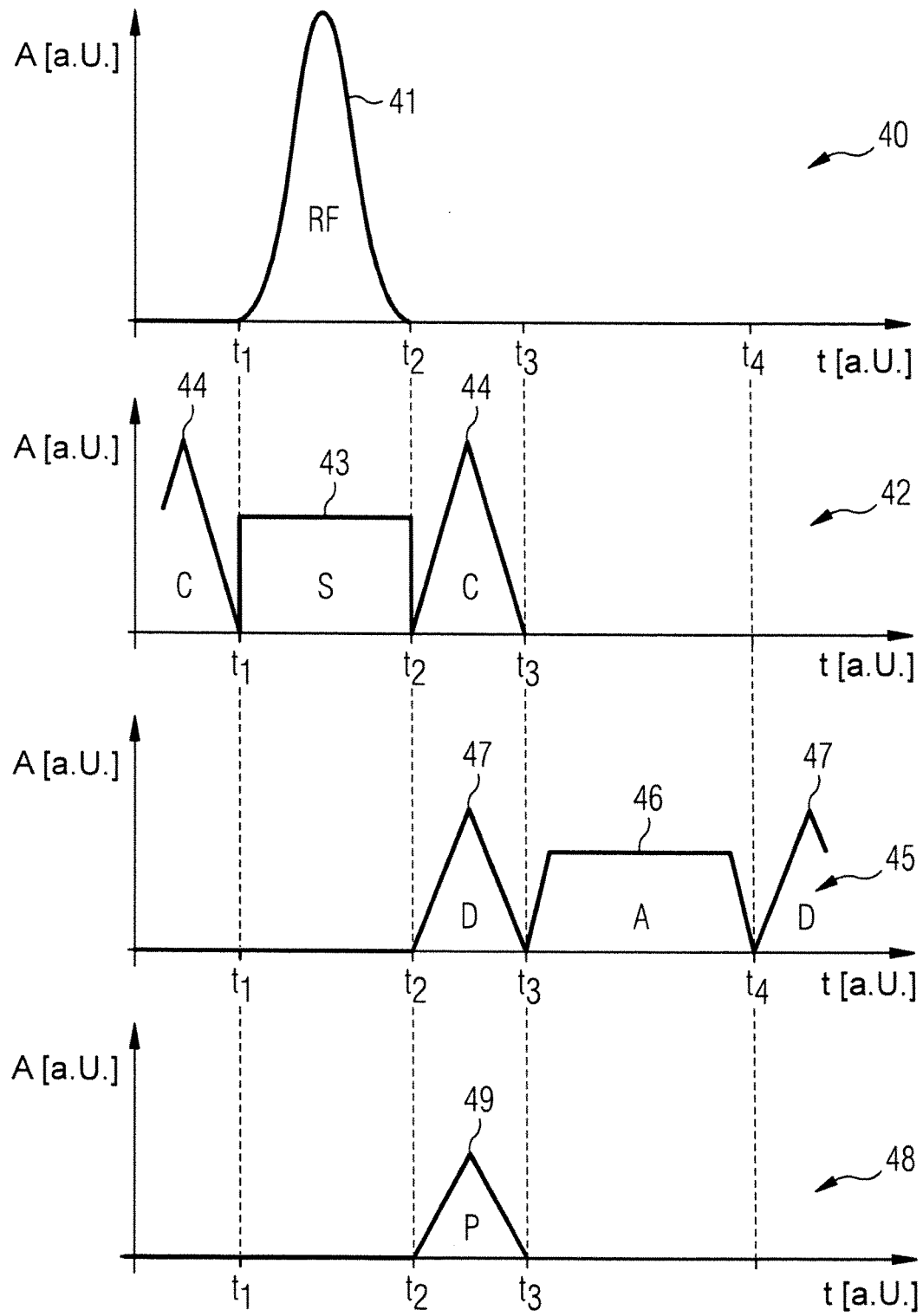
FIG. 3 schematically illustrates individual pulses of a pulse sequence to which the method according to the invention can be applied.

The temporal correlations between the individual pulse series including the readout gradients and phase coding gradients (not shown in FIG. 2) are explained in the following using FIG. 3. FIG. 3 shows (in a very schematic manner) a pulse sequence to which the method according to the invention can be applied. A radio-frequency pulse 41 is plotted in a graph 40 with its amplitude over time, in arbitrary units. The radio-frequency pulse 41 should be a refocusing pulse, for example corresponding to the refocusing pulses 33 in FIG. 2. Shown below this in a graph 42 is an amplitude curve over time of the slice selection gradient. The depiction again takes place in arbitrary units. A slice selection gradient pulse 43 with a moment S is flanked by two gradient spoilers 44 with a spoiler moment of C, respectively.

The amplitude over time of a readout gradient is plotted in arbitrary units in a graph 45. A readout gradient pulse 46 with a readout gradient moment A is flanked by two readout spoilers 47 with a readout spoiler moment of D, respectively.

The amplitude curve of a phase coding gradient over time is likewise plotted in arbitrary units in a graph 48. A phase coding gradient pulse 49 provides for a spatial coding in the phase coding direction.

The refocusing pulse 41 begins at a point in time $t_1$ and ends at a point in time $t_2$. The difference $\Delta t = t_2 - t_1$ designates the pulse duration of the refocusing pulse 41 that is optimized according to the invention. The slice selection gradient pulse 43 is executed simultaneously with the refocusing pulse 41, meaning that the slice selection gradient pulse 43 likewise begins at the point in time $t_1$ and ends at the point in time $t_2$. It ensures that the refocusing pulse 41 acts on a selected slice. There is subsequently a readout window from the time $t_3$ to the time $t_4$, in which the readout gradient pulse 56 is executed. The phase coding gradient 49 (which begins at the point in time $t_2$ and ends at the point in time $t_3$) is executed before the readout gradient pulse 46 and after the slice selection gradient pulse 43. Not drawn in FIG. 3 is a possible subsequent refocusing pulse that is executed at a point in time $t_5$ after the final readout spoiler pulse 47.

The interval between two refocusing pulses is the echo interval, what is known as the echo spacing ESP. This echo spacing can remain unchanged according to the invention. An echo time can also be freely selected by the user depending on his imaging task. The spoiler pulses—i.e. both the slice selection gradient spoiler pulses 44 and the readout spoiler pulses 47—serve to suppress FID signals. For this they must have a specific total spoiler moment C+D. The duration of the spoiler pulses is predetermined by the end of the refocusing pulse at the point in time $t_2$ and the chronological beginning of the readout window (i.e. of the readout gradient pulse 46) at the point in time $t_3$. The chronological position of the readout window is determined by the echo time. In order to be able to achieve the spoiler moment that suppresses the FID signals, the amplitudes of the spoiler pulses are high (as can be seen in FIG. 2) since the provided time is strictly limited. If it is not desired to vary the echo spacing and/or the echo time, there is barely any margin for a variation of the spoiler pulses. The inventive method is applied here.

Figure 4:
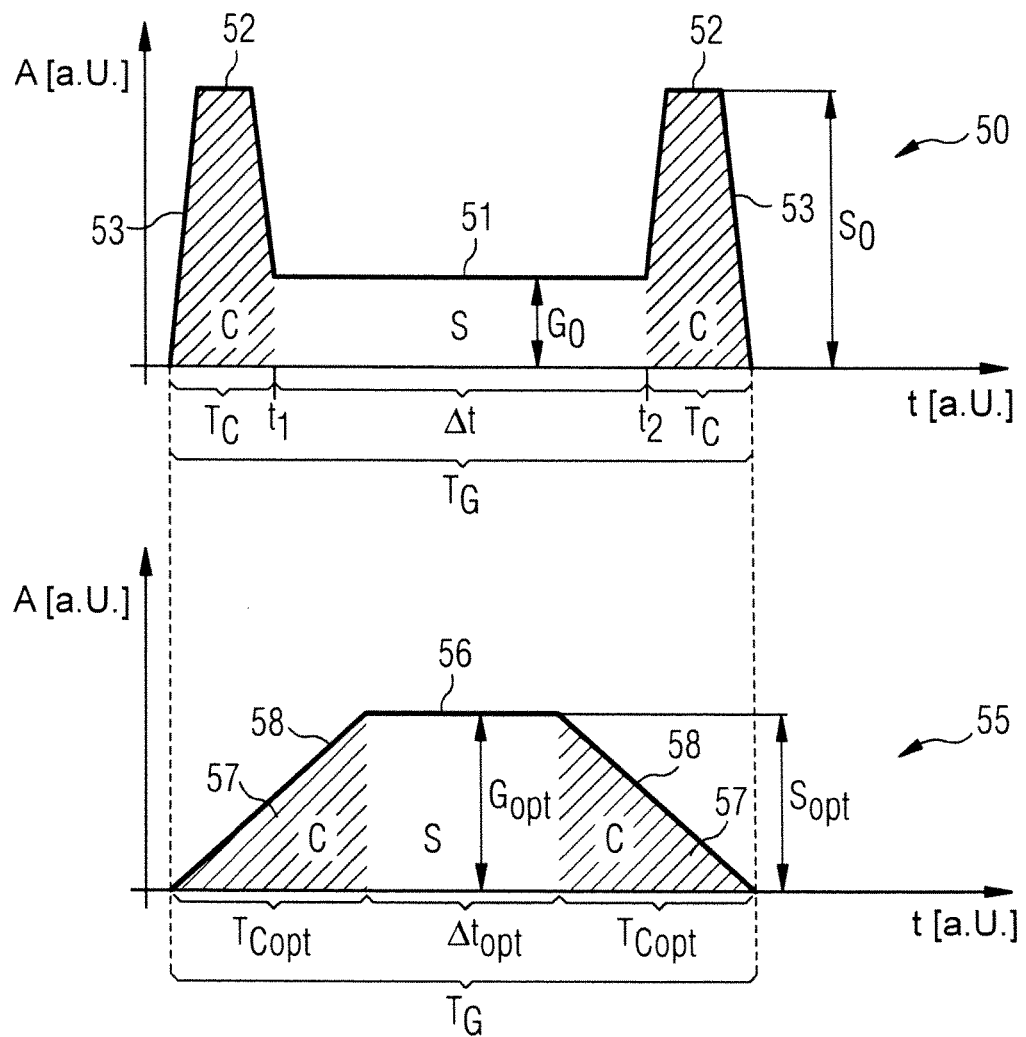
FIG. 4 schematically illustrates a slice-selection gradient pulse with gradient spoiler pulses in unadapted form, and in a form adapted according to the invention

FIG. 4 shows a detail of FIG. 3 in a graph 50. A slice selection gradient pulse 51 that can correspond to the slice selection gradient pulses 35 from FIG. 2 and the slice selection gradient pulse 43 from FIG. 3 is plotted in arbitrary units with its gradient spoiler pulses 52 (corresponding to gradient spoilers 37 and gradient spoilers 44) with its amplitude over time. The slice selection gradient pulse 51 begins at a time $t_1$ and ends at a time $t_2$; its pulse duration is $\Delta t$. The amplitude of the slice selection gradient pulse 51 is $G_0$. A total duration $T_G$ is predetermined by the echo time or the echo spacing. The spoiler or crusher pulses respectively have a duration $T_C$ that results from $$T_C = (T_G - \Delta t) \div 2 \quad (1)$$

The area of the crusher pulses 52 (shown shaded in FIG. 4) is predetermined for a certain suppression of FID signals. An amplitude $S_0$ for the crusher pulses 52 is thus predetermined with a predetermined duration $T_C$. The rise time is short, meaning that an edge 52 is very steep; the slew rate $\Delta S_0/dt$ is high.

A graph 55 (lying under the graph 50 in FIG. 4) shows a gradient curve optimized according to the invention, with an optimized pulse duration for the slice-selection gradients. The amplitude of a slice-selection gradient pulse 56 and flanking gradient spoiler pulses 57 is plotted over time in arbitrary units in graph 55. The total duration $T_G$ for the execution of the slice-selection gradient pulse 56 and the gradient spoiler pulses 57 is unmodified relative to the graph 50. The echo spacing of the refocusing pulses and the readout window have not changed. The slice-selection gradient pulse 56 has a length $\Delta t_{opt}$ and an amplitude $G_{opt}$. The length $\Delta t_{opt}$ results from the shortened length of the associated refocusing pulse, as explained in connection with FIG. 3. Because $\Delta t_{opt}$ is smaller than $\Delta t$, more time $t_{opt}$ is provided for the spoiler pulses 57. The predetermined spoiler moment C—i.e. the predetermined area content of the shaded area that is bounded by the spoiler pulse amplitude and the time axis and is provided by the original spoiler pulse 52—can now be achieved in a triangular area. An edge 58 is significantly flatter than the edge 53; the slew rate $\Delta S/dt$ is lower. An amplitude $S_{opt}$ of the spoiler pulses 57 is thereby smaller than the amplitude $S_0$ of the spoiler pulses 52 and just as large as the amplitude $G_{opt}$ of the slice-selection gradient pulse 56.

As is apparent in graph 55 (FIG. 4), not only has the slice-selection gradient 56 been temporally shortened in its duration according to the shortened duration of the refocusing pulse; rather, the amplitude $G_{opt}$ has been increased relative to the unmodified slice-selection gradient. The correlation between the temporal shortening and the increased amplitude should be explained in the following using FIG. 5.

Figure 5:
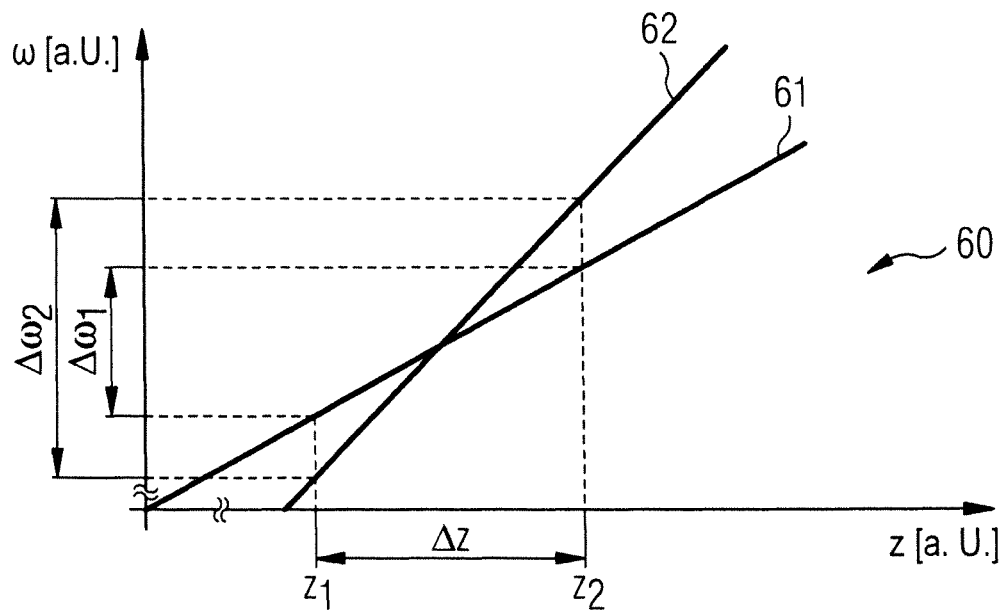
FIG. 5 is a graph of the correlation between refocusing pulse bandwidth and slice thickness.

FIG. 5 shows the slice selection in a graph 60 in which a bandwidth $\Omega$ of the refocusing pulse is plotted in arbitrary units over a slice coordinate z in arbitrary units. A slice from $z_1$ to $z_2$ with a slice thickness $\Delta z$ should be selected, predetermined by a desired image acquisition and the original pulse sequence. The original bandwidth of the refocusing pulse should have been $\Delta\omega 1$. The bandwidth of the refocusing pulse has been increased due to the temporal shortening of the refocusing pulse to an optimal pulse duration. The optimized bandwidth is $\Delta\omega 2$. The slice from $z_1$ to $z_2$ with the thickness $\Delta z$ was selected with the original bandwidth $\Delta\omega 1$ and an original slice-selection gradient strength $G_0$ (as it is shown in a straight line 61). With an expanded bandwidth $\Delta\omega 2$, the gradient strength must be increased to $G_{opt}$ (as shown in a straight line 62) so that the same slice thickness $\Delta z$ is furthermore selected with the bandwidth $\Delta\omega 2$. If the amplitude of the slice-selection gradient were to remain at $G_0$ (i.e. the straight line 61), a markedly larger slice thickness would be selected. This correlation between gradient strength and slice thickness is generally known and here should be explained again briefly for a better understanding.

The gradient spoiler moment C is dependent on the slice thickness $\Delta z$. Since the slice thickness remains unchanged, no parameters for the image acquisition itself should be modified in the pulse sequence; the gradient spoiler moment C also remains the same given the optimization. Pulse duration $\Delta t$ and gradient strength G change. In the optimized case according to graph 55, the gradient spoiler moment C is thus provided by $$C = \tfrac{1}{2} G \cdot T_C = \tfrac{1}{4} G \cdot (T_G - \Delta t) \quad (2)$$

due to the triangular shape.

As explained above, the pulse bandwidth $\omega$ coincides with the pulse duration $\Delta t$; for example, given SINC-shaped pulses, the bandwidth $\omega$ is:

$$\omega = 1.21 \div \Delta t \quad (3)$$

For the given slice thickness $\Delta z$, it must thus apply that:

$$\Delta z = \omega \div (\gamma \cdot G) \quad (4)$$

wherein $\gamma$=gyromagnetic ratio.

Given SINC-shaped refocusing pulses, the optimal refocusing pulse bandwidth $\omega_{opt}$ follows from this:

$$\omega_{opt} = (4 \cdot C - 1,21 \div (\gamma \cdot \Delta z)) \div T_G \quad (5)$$

A fixed correlation between refocusing pulse bandwidth $\omega_{opt}$, the slice thickness $\Delta z$ and the spoiler moment C is also provided for refocusing pulses with a different shape. The frequently used SINC pulse is only indicated as an example here. The optimal bandwidth is thus dependent on the spoiler moment and the total duration $T_G$ that are necessary for the suppression of the FID signals.

Figure 6:
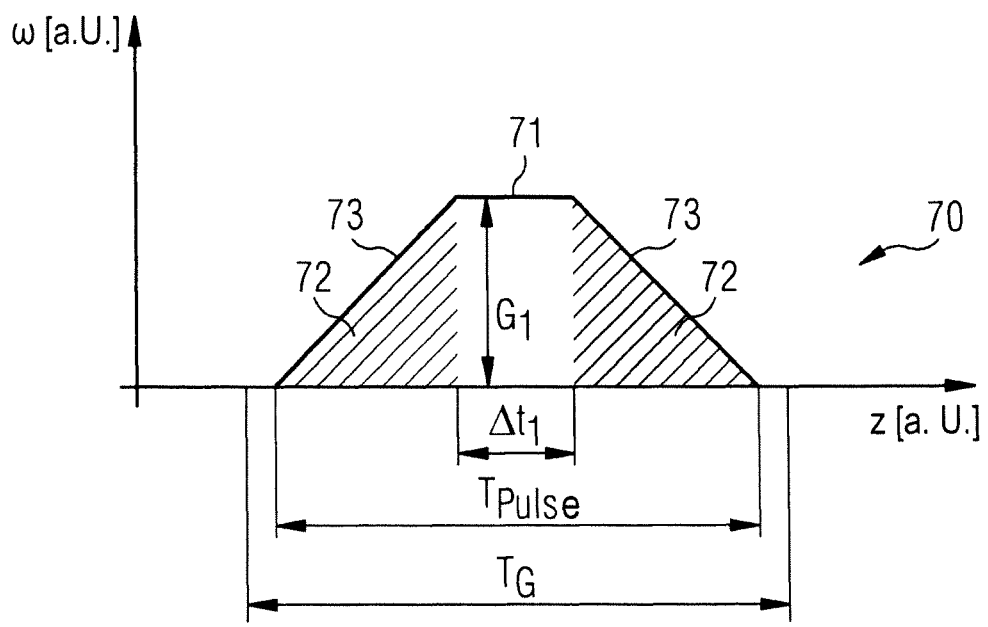
FIG. 6 shows a slice-selection gradient pulse with gradient spoiler pulses that are suboptimally adapted.

In some cases, depending on the magnetic resonance system that is used an optimal noise minimization cannot be achieved with the optimal gradient curve according to graph 55 (FIG. 4) because an acoustic resonance frequency of the magnetic resonance system is excited precisely at this gradient curve. In one example, the optimized pulse sequence can therefore also have a slice-selection gradient curve as shown in a graph 70 in FIG. 6.

The amplitude of the gradient pulses over time (respectively in arbitrary units) is again plotted in graph 70. A slice-selection gradient pulse 71 has an amplitude $G_1$ that is greater than the amplitude $G_0$ and greater than the amplitude $G_{opt}$. The pulse duration $\Delta t1$ is shorter than the optimal pulse duration $\Delta t_{opt}$ and shorter than the original duration $\Delta t$. This means that the refocusing pulse also has a pulse duration $\Delta t$ that is shorter than the optimal pulse duration $\Delta t_{opt}$. That in turn means that the bandwidth $\omega$ of the refocusing pulse is greater than the original bandwidth $\omega$ and greater than the optimal bandwidth $\omega_{opt}$. The spoiler pulses 72 have a maximum amplitude that is equal to the amplitude $G_1$ of the slice-selection gradient pulse. A trapezoidal shape of the total pulse is thus achieved. The amplitudes of the spoiler pulses 72 are therefore greater than in the case presented in graph 55. The spoiler pulses 72 must therefore be temporally shortened so that the same spoiler moment is maintained. The total pulse duration of spoiler pulse, slice-selection gradient pulse and second spoiler pulse is $T_{Pulse}$. $T_{Pulse}$ is smaller than the total time $T_g$, meaning that the total time provided is not utilized. The gradient curve shown in graph 70 is not the optimal curve since edges 73 of the spoiler pulses 72 are steeper than the edges 58 of the spoiler pulses 57, thus in principle causes a higher noise exposure. For the reasons explained above, graph 70 can nevertheless be the optimized pulse sequence in order to avoid the occurrence of an acoustic resonance.

FIG. 7 shows a workflow plan of an embodiment of the method according to the invention. The input variable at the start S of the method is a pulse sequence that was calculated for a defined imaging task. In Step I, a pulse duration of the refocusing pulse is shortened. In Step II, the pulse duration of a slice-selection gradient pulse is adapted to the shortened pulse duration of the refocusing pulse. The adaptation takes place under the requirement that the slice-selection gradient pulse must be executed simultaneously with the refocusing pulse and during the refocusing pulse. In Step III, an amplitude of the slice-selection gradient pulse is increased so that the same slice thickness is selected as before the shortening of the pulse duration of the refocusing pulse. This correlation has been explained in detail above with reference to FIG. 5. The shortened pulse duration of the refocusing pulse is accompanied by an increased bandwidth of the refocusing pulse, and therefore requires an increase of the amplitude of the slice-selection gradient. Result E of the method is a pulse sequence whose pulse shape of the gradient spoiler pulse was adapted without changing the total spoiler moment, such that an optimally shortened pulse duration of the refocusing pulse is achieved. The adaptation of the pulse shape of the gradient spoiler pulse thereby takes place so that a maximum amplitude of the gradient spoiler pulse can be equated with the amplitude of the slice-selection gradient pulse and an edge steepness of the gradient spoiler pulse is minimized.

FIG. 8 shows a somewhat more complex embodiment of the method in which an optimally predetermined SAR limitation is also complied with and—at the acoustic resonance frequencies of the magnetic resonance system—a shift of the frequency spectrum of the gradient spoiler pulses is made necessary, such that the sought optimal pulse shape of the gradient spoiler pulse is not used in the optimized pulse sequence.

The method as presented in a workflow plan in FIG. 8 begins again at a start point S with a predetermined pulse sequence that includes at least one refocusing pulse, one slice-selection gradient pulse and one gradient spoiler pulse. It can be an SE or TSE sequence, or another pulse sequence to which the requirements apply. In Step 1, a shortened pulse duration of the refocusing pulse is again determined, accompanied by an increased bandwidth $\omega$ of the refocusing pulse. In Step II, a pulse duration of the slice-selection gradient pulse is adapted to the shortened pulse duration of the refocusing pulse. In Step III, an amplitude of the slice-selection gradient pulse is increased so that the same slice thickness is selected as before the shortening of the pulse duration of the refocusing pulse. In Step IV, the pulse shape of a readout spoiler pulse is reviewed and—to achieve the optimal pulse shape—gradient spoiler moment and readout spoiler moment are considered together, and if necessary the gradient spoiler moment is modified while maintaining the total spoiler moment. This means that a portion of the gradient spoiler moment can be adopted by the readout spoiler moment; the gradient spoiler moment is reduced when the readout spoiler moment is increased, and vice versa.

Steps I through III and IV are run through in an iterative process. This means that Step II and Step III (possibly with Step V) are executed after a first shortening of the pulse duration of the refocusing pulse has been applied. The result is subsequently fed into Step I again if the optimal result has not yet been achieved, and a shortening of the pulse duration is conducted again. A Step VIII in which the acoustic resonance frequency of the magnetic resonance system is considered can be conducted in the loopback path. In Step VIII, a frequency spectrum of the currently optimized pulse sequence is considered and compared with the acoustic resonance frequency. If the acoustic resonance frequency lies in the frequency spectrum of the pulse sequence, a corresponding communication to Block I takes place and the pulse duration or the bandwidth of the refocusing pulse is changed accordingly.

A minimum allowed pulse duration of the refocusing pulse can optionally be determined in Step V, in which a maximum SAR limitation that is provided for the refocusing pulse is not exceeded. The minimum allowed pulse duration of the refocusing pulse is fed into Block I and taken into account in Step I. For example, that can mean that an iteration process is terminated if the minimum allowed pulse duration is achieved, even if an optimal pulse shape of the gradient spoiler pulse has not yet been achieved.

If the optimal pulse shape is achieved in Step III (possibly after multiple iteration passes), in Step VI the readout spoiler pulse can be adapted to the shortened pulse duration of the refocusing pulse. This means (as is apparent in FIG. 3) that more time is provided for the readout spoiler pulse that lies between the point in time $t_2$ and the point in time $t_3$, since the point in time $t_2$ is pushed closer to the time $t_1$ by the shortening of the pulse duration of the refocusing pulse 41. This means that the difference $t_3-t_2$ has become larger. Given maintenance of the readout spoiler moment, the amplitude of the readout spoiler moment can be decreased and the edge steepness for the readout spoiler can therefore also be reduced. The same accordingly applies to the phase coding gradient 49 in FIG. 3, which can likewise be adapted (in Step VII in FIG. 8) to the shortened pulse duration of the refocusing pulse 41 that is found in the optimization process. The phase coding gradient 49 is also executed between the points in time $t_2$ and $t_3$. If $t_2$ is earlier, the difference $t_3-t_2$ is greater and the phase coding gradient curve can be designed to be flatter; the slew rate also drops here. Each gradient slew rate contributes to the noise exposure, independent of whether it relates to the slice-selection gradients, the readout gradients or the phase coding gradients. It is thus desirable to design any edge to be flatter.

The method as presented in FIG. 8 ends with an optimized pulse sequence at a point E.

In conclusion, it is noted again that the methods and designs described in detail in the preceding are exemplary embodiments, and that the basic principle can also be varied in wide ranges by those skilled in the art without departing from the scope of the invention. In particular, it is again noted that the method according to the invention can be applied not only to spin echo methods and turbo spin echo methods, but also to other sequences.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to optimize a pulse sequence in order to then operate a magnetic resonance system in order to acquire magnetic resonance data from a subject, said method comprising:

accessing a protocol database in order to obtain a control protocol that comprises an electronic designation of a pulse sequence as an input to a processor, said pulse sequence including at least one refocusing pulse that has a pulse duration and a bandwidth that makes said refocusing pulse effective in a slice thickness of the subject, one slice selection gradient pulse having a pulse duration, and one gradient spoiler pulse having a pulse shape and a spoiler moment, said pulse sequence, when executed by said magnetic resonance system, producing noise at a noise volume;

in said processor, automatically executing a pulse sequence optimization algorithm in order to reduce said noise volume, in which said pulse duration of said refocusing pulse is iteratively shortened by an amount that changes the slice thickness in which said refocusing pulse is effective, and in which said pulse duration of the slice selection gradient pulse is iteratively adapted to each iterative shortening of the pulse duration of the refocusing pulse by iteratively increasing an amplitude of the slice selection gradient pulse in order to cause a slice thickness to be selected by the slice selection gradient pulse that makes said refocusing pulse effective in the same slice thickness as existed before each iteration that shortens the pulse duration of the refocusing pulse;

also in the execution of said pulse sequence optimization algorithm in said processor, iteratively adapting said pulse shape of the gradient spoiler pulse to each iterative adaptation of the slice selection gradient pulse, without changing the spoiler moment, so as to achieve, at an end of said pulse sequence optimization algorithm, a refocusing pulse in said pulse sequence that has an optimally shortened pulse duration of the refocusing pulse that occurs when, by a totality of the iterations of adapting the pulse shape of the gradient spoiler pulse, a maximum amplitude of the gradient spoiler pulse becomes equal to the amplitude of the slice selection gradient pulse and an edge steepness of the gradient spoiler pulse becomes minimized; and making the pulse sequence produced at the end of said pulse sequence optimization algorithm, which has the refocusing pulse with said optimally shortened duration, the slice selection gradient pulse with the adapted pulse duration and the adapted amplitude, along with the gradient spoiler pulse with the adapted pulse shape, available at an output of the processor in electronic form that is in a format configured to use said pulse sequence in order to operate said magnetic resonance system with said noise volume being reduced.

2. A method as claimed in claim 1 comprising selecting said pulse sequence supplied to said processor from the group consisting of spin echo sequences having an echo spacing and turbo spin echo sequences having an echo spacing, and comprising producing said optimally shortened pulse duration of the refocusing pulse and adapting the pulse shape of the gradient spoiler pulse while leaving said echo spacing unmodified.

3. A method as claimed in claim 2 wherein said pulse sequence supplied to said processor comprises a plurality of refocusing pulses, and comprising producing said optimally shortened pulse duration for each of multiple refocusing pulses in said plurality of refocusing pulses.

4. A method as claimed in claim 1 comprising, in said processor, determining a minimum permissible pulse duration of said refocusing pulse that does not result in a maximum SAR limitation, which is predetermined for said pulse sequence, being exceeded, and generating said optimally shortened pulse duration of said refocusing pulse so as to not fall below said minimum permissible pulse duration.

5. A method as claimed in claim 1 wherein said pulse sequence also comprises a readout spoiler pulse and a phase coding pulse, each having an edge steepness, and comprising reducing the edge steepness of at least one of said readout spoiler pulse and said phase coding pulse in adaptation to the shortened pulse duration of the refocusing pulse.

6. A method as claimed in claim 1 wherein said magnetic resonance system has at least one acoustic resonance frequency that is within a frequency spectrum of the adapted gradient spoiler pulse and comprising, in said processor, determining whether said refocusing pulse with said optimally shortened pulse duration causes said frequency spectrum to shift so that said acoustic resonance frequency is outside of said frequency spectrum and, if so, modifying the pulse duration of the refocusing pulse to deviate from said optimally shortened pulse duration.

7. A method as claimed in claim 1 wherein said refocusing pulse has an amplitude that proceeds in an amplitude direction, and comprising shortening the pulse duration of the refocusing pulse by extending the refocusing pulse in said amplitude direction.

8. A method to operate a magnetic resonance system in order to acquire magnetic resonance from a subject, said method comprising:

accessing a protocol database in order to obtain a control protocol that comprises an electronic designation of a pulse sequence as an input into a processor, said pulse sequence including at least one refocusing pulse that has a pulse duration and a bandwidth that makes said refocusing pulse effective in a slice thickness of the subject, one slice selection gradient pulse having a pulse duration, and one gradient spoiler pulse having a pulse shape and a spoiler moment, said pulse sequence, when executed by said magnetic resonance system, producing noise at a noise volume;

in said processor, automatically executing a pulse sequence optimization algorithm in order to reduce said noise volume, in which said pulse duration of said refocusing pulse is iteratively shortened by an amount that changes the slice thickness in which said refocusing pulse is effective, and in which said pulse duration of the slice selection gradient pulse is iteratively adapted to each iterative shortening of the pulse duration of the refocusing pulse by iteratively increasing an amplitude of the slice selection gradient pulse in order to cause a slice thickness to be selected by the slice selection gradient pulse that makes said refocusing pulse effective in the same slice thickness as existed before each iteration that shortens the pulse duration of the refocusing pulse;

also in the execution of said pulse sequence optimization algorithm in said processor, iteratively adapting said pulse shape of the gradient spoiler pulse to each iterative adaptation of the slice selection gradient pulse, without changing the spoiler moment, so as to achieve, at an end of said pulse sequence optimization algorithm, a refocusing pulse in said pulse sequence that has an optimally shortened pulse duration of the refocusing pulse that occurs when, by a totality of the iterations of adapting the pulse shape of the gradient spoiler pulse, a maximum amplitude of the gradient spoiler pulse becomes equal to the amplitude of the slice selection gradient pulse and an edge steepness of the gradient spoiler pulse becomes minimized; and making the pulse sequence produced at the end of said pulse sequence optimization algorithm, which has the refocusing pulse with said optimally shortened duration, the slice selection gradient pulse with the adapted pulse duration along with the adapted amplitude, and the gradient spoiler pulse with the adapted pulse shape, available from the processor to the magnetic resonance system in electronic form that is in a format configured to use said pulse sequence in order to operate said magnetic resonance system, and operating the magnetic resonance system with said noise volume being reduced by executing said pulse sequence provided from the processor.

9. A pulse sequence determination system optimizing a pulse sequence in order to then operate a magnetic resonance system in order to acquire magnetic resonance data from a subject, said pulse sequence determination system comprising:

a processor that accesses a protocol database in order to obtain a control protocol that comprises an electronic designation of a pulse sequence as an input into the processor, said pulse sequence including at least one refocusing pulse that has a pulse duration and a bandwidth that makes said refocusing pulse effective in a slice thickness of the subject, one selection gradient pulse having a pulse duration, and one gradient spoiler pulse having a pulse shape and a spoiler moment, said pulse sequence, when executed by said magnetic resonance system, producing noise at a noise volume;

said processor being configured to automatically execute a pulse sequence optimization algorithm in order to reduce said noise volume, in which said pulse duration of said refocusing pulse is iteratively shortened by an amount that changes the slice thickness in which said refocusing pulse is effective, and in which said pulse duration of the slice selection gradient pulse is iteratively adapted to each iterative shortening of the pulse duration of the refocusing pulse by iteratively increasing an amplitude of the slice selection gradient pulse in order to cause a slice thickness to be selected by the slice selection gradient pulse that makes said refocusing pulse effective in the same slice thickness as existed before each iteration that shortens the pulse duration of the refocusing pulse;

said processor, also in the execution of said pulse sequence optimization algorithm, being configured to iteratively adapt said pulse shape of the gradient spoiler pulse to each iterative adaptation of the slice selection gradient pulse, without changing the spoiler moment, so as to achieve, at an end of said pulse sequence optimization algorithm, a refocusing pulse in said pulse sequence that has an optimally shortened pulse duration of the refocusing pulse that occurs when, by a totality of the iterations of adapting the pulse shape of the gradient spoiler pulse, a maximum amplitude of the gradient spoiler pulse becomes equal to the amplitude of the slice selection gradient pulse and an edge steepness of the gradient spoiler pulse becomes minimized; and said processor being configured to make the pulse sequence produced at the end of said pulse sequence optimization algorithm, which has the refocusing pulse with said optimally shortened duration, the slice selection gradient pulse with the adapted pulse duration and the adapted amplitude, along with the gradient spoiler pulse with the adapted pulse shape, available at an output of the processor in electronic form that is in a format configured to use said pulse sequence in order to operate said magnetic resonance system with said noise volume being reduced.

10. A magnetic resonance apparatus comprising:

a magnetic resonance data acquisition scanner comprising a radio-frequency (RF) antenna and a gradient coil arrangement;

a protocol database in which a plurality of control protocols are stored, a processor configured to access said protocol database in order to obtain a control protocol that comprises an electronic designation of a pulse sequence as an input into the processor, said pulse sequence including at least one refocusing pulse that has a pulse duration and a bandwidth that makes said refocusing pulse effective in a slice thickness of the subject, one selection gradient pulse having a pulse duration, and one gradient spoiler pulse having a pulse shape and a spoiler moment, said pulse sequence, when executed by said magnetic resonance system, producing noise at a noise volume;

said processor being configured to automatically execute a pulse sequence optimization algorithm in order to reduce said noise volume, in which said pulse duration of said refocusing pulse is iteratively shortened by an amount that changes the slice thickness in which said refocusing pulse is effective, and in which said pulse duration of the slice selection gradient is iteratively adapted to each iterative shortening of the pulse duration of the refocusing pulse by iteratively increasing an amplitude of the slice selection gradient pulse in order to cause a slice thickness to be selected by the slice selection gradient pulse that makes said refocusing pulse effective in the same slice thickness as existed before each iteration that shortens the pulse duration of the refocusing pulse;

said processor, also in the execution of said pulse sequence optimization algorithm being configured to iteratively adapt said pulse shape of the gradient spoiler pulse to each iterative adaptation of the slice selection gradient pulse, without changing the spoiler moment, so as to achieve, at an end of said pulse sequence optimization algorithm, a refocusing pulse in said pulse sequence that has an optimally shortened pulse duration of the refocusing pulse that occurs when, by a totality of the iterations of adapting the pulse shape of the gradient spoiler pulse, a maximum amplitude of the gradient spoiler pulse becomes equal to the amplitude of the slice selection gradient pulse and an edge steepness of the gradient spoiler pulse becomes minimized; and said processor being configured to provide the pulse sequence produced at the end of said pulse sequence optimization algorithm, which has the refocusing pulse with said optimally shortened duration, the slice selection gradient pulse with the adapted pulse duration and the adapted amplitude, along with the gradient spoiler pulse with the adapted pulse shape, from the processor to the scanner in electronic form that is in a format configured to operate said scanner with the noise volume being reduced, and to operate said scanner to radiate said refocusing pulse with the shortened duration with said RF antenna, and to activate the slice selection gradient pulse with the adapted pulse duration and the adapted amplitude, and the gradient spoiler pulse with the adapted pulse shape, with said gradient pulse arrangement.

11. A non-transitory, computer-readable data storage medium encoded with programming instructions, said data storage medium being loaded into a processor of a magnetic resonance system adapted to receive a subject therein from whom magnetic resonance data are to be acquired, said programming instructions causing said processor to:

access a protocol database in order to obtain a control protocol that comprises an electronic designation of a pulse sequence as an input to the processor, said pulse sequence including at least one refocusing pulse that has a pulse duration and a bandwidth that makes said refocusing pulse effective in a slice thickness of the subject, one selection gradient pulse having a pulse duration, and one gradient spoiler pulse having a pulse shape and a spoiler moment, said pulse sequence, when executed by said magnetic resonance system, producing noise at a noise volume;

automatically execute a pulse sequence optimization algorithm in order to reduce said noise volume, in which said pulse duration of said refocusing pulse is iteratively shortened by an amount that changes the slice thickness in which said refocusing pulse is effective, and in which said pulse duration of the slice selection gradient pulse is iteratively adapted to each iterative shortening of the pulse duration of the refocusing pulse by iteratively increasing an amplitude of the slice selection gradient pulse in order to cause a slice thickness to be selected by the slice selection gradient pulse that makes said refocusing pulse effective in the same slice thickness as existed before each iteration that shortens the pulse duration of the refocusing pulse;

also in the execution of said pulse sequence optimization algorithm, iteratively adapt said pulse shape of the gradient spoiler pulse to each iterative adaptation of the slice selection gradient pulse, without changing the spoiler moment, so as to achieve, at an end of said pulse sequence optimization algorithm, a refocusing pulse in said pulse sequence that has an optimally shortened pulse duration of the refocusing pulse that occurs when, by a totality of the iterations of adapting the pulse shape of the gradient spoiler pulse, a maximum amplitude of the gradient spoiler pulse becomes equal to the amplitude of the slice selection gradient pulse and an edge steepness of the gradient spoiler pulse becomes minimized; and make the pulse sequence produced at the end of said pulse sequence optimization algorithm, which has the refocusing pulse with said optimally shortened duration, the slice selection gradient pulse with the adapted pulse duration along with the adapted amplitude, and the gradient spoiler pulse with the adapted pulse shape, available at an output of the processor in electronic form that is in a format configured to use said pulse sequence in order to operate said magnetic resonance system with said noise volume being reduced.

* * * * *